(12) United States Patent
Kim et al.

(10) Patent No.: US 7,618,553 B2
(45) Date of Patent: Nov. 17, 2009

(54) INSULATING MATERIAL FOR PRINTED CIRCUIT BOARD

(75) Inventors: Jin Cheol Kim, Gyunggi-do (KR); Jun Rok Oh, Seoul (KR); Tae Kyoung Kim, Gyunggi-do (KR); Sang Jun Yoon, Seoul (KR); Hwa Young Lee, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 108 days.

(21) Appl. No.: 11/902,487

(22) Filed: Sep. 21, 2007

(65) Prior Publication Data

US 2008/0081177 A1   Apr. 3, 2008

(30) Foreign Application Priority Data

Sep. 29, 2006 (KR) .................. 10-2006-0095758

(51) Int. Cl.
*B32B 5/16* (2006.01)
*B32B 27/06* (2006.01)
*B32B 27/36* (2006.01)
*C09K 19/52* (2006.01)

(52) U.S. Cl. .................. 252/299.01; 428/323; 428/480
(58) Field of Classification Search ............ 252/299.01; 428/323, 480
See application file for complete search history.

(56) References Cited

U.S. PATENT DOCUMENTS

2008/0212299 A1*  9/2008  Kim et al. .................. 361/763

FOREIGN PATENT DOCUMENTS

| JP | 4-161461 | 6/1992 |
| JP | 9-118562 | 5/1997 |
| JP | 2003-342478 | 12/2003 |
| JP | 2006-176564 | 7/2006 |

OTHER PUBLICATIONS

Japanese Office Action issued on Mar. 24, 2009 in corresponding Japanese Patent Application 2007-249849.
Japanese Patent Office Action, mailed Aug. 12, 2008 and issued in corresponding Japanese Patent Application No. 2007-249849.

* cited by examiner

*Primary Examiner*—Geraldina Visconti

(57) ABSTRACT

Disclosed is an insulating material for a printed circuit board, including a liquid crystal polyester resin and ceramic powder, thus exhibiting a temperature coefficient of capacitance ranging from −300 to +300 ppm/° C. in the temperature range of −55~125° C. and a dielectric constant ranging from 5 to 40. This insulating material has superior dielectric properties, and a small change in dielectric constant depending on the change in temperature, and thus exhibits high reliability when applied to high-frequency circuits.

6 Claims, 4 Drawing Sheets

INSULATING MATERIAL FOR PRINTED CIRCUIT BOARD

CROSS REFERENCE TO RELATED APPLICATION

This application claims the benefit of Korean Patent Application No. 10-2006-0095758, filed Sep. 29, 2006, entitled "Insulating material for printed circuit board", which is hereby incorporated by reference in its entirety into this application.

BACKGROUND OF THE INVENTION

1. Field of the Invention

The present invention relates, in general, to an insulating material for a printed circuit board (PCB). More particularly, the present invention relates to an insulating material for a PCB, which includes a liquid crystal polyester resin and ceramic powder to exhibit superior dielectric properties and a small change in dielectric constant depending on changes in temperature so as to realize excellent reliability when applied to high-frequency circuits.

2. Description of the Related Art

Generally, in proportion to an increase in the speed and capacity of an electronic apparatus, the frequency of a signal, which is transmitted along the line of a PCB, is increased. To transmit the high-frequency signal without loss, such as signal reflection, impedance matching of an input terminal and an output terminal is regarded as very important.

As operating frequencies are increased to high frequencies, in particular, to the GHz (Gigahertz) level, almost all energy components of the signal between a signal line and a GND (ground) are transmitted in the form of an alternating current field. Accordingly, when the height or dielectric constant of an insulating material (the dielectric of a substrate) between the signal line and the GND is exactly uniform, signal loss, such as signal reflection, attributable to the difference in impedance, may be minimized, and furthermore, signal integrity may be assured.

In this regard, an epoxy resin, for example, FR-4, which is mainly used as the insulating material of a PCB, is greatly changed in dielectric constant depending on the change in temperature, as illustrated in FIG. 1, and therefore has −91897 ppm at −55° C. and 81712 ppm at 125° C., relative to the dielectric constant at 25° C. From this, a TCC (Temperature Coefficient of Capacitance) is determined to be 960 or more ppm/° C. The great change in dielectric constant of the epoxy resin depending on the temperature is considered to be a limitation in the ability to design a circuit of a PCB for transmitting the high-frequency signal in consideration of impedance matching. The dielectric constant of an electronic apparatus changes depending on the surrounding environment, in particular, temperature, and thereby the impedance of the matched signal line varies, undesirably causing signal loss, such as signal reflection.

In order to solve problems due to the impedance mismatch of the signal line upon the transmission of the high-frequency signal, the development of an insulating material for a PCB having a stable dielectric constant, that is, a low TCC (temperature coefficient of capacitance), depending on the change in temperature, is being extensively conducted these days in universities and research institutes, and by some advanced substrate manufacturers.

To date, an insulating material for high-frequency signal transmission has been actively developed according to the trend toward a low dielectric constant for increasing a transmission speed and a low dissipation factor for minimizing signal loss. The development of the insulating material for high-frequency signal transmission has progressed to the preparation of a resin having a dielectric constant and a dissipation factor lower than conventional epoxy resins and to the improvement of dielectric properties through the dispersion/addition of a high-frequency ceramic filler.

In the former case, research into the addition of conventional epoxy with PPE (PolyPhenylene Ether) or the formation of an epoxy structure into an interpenetrating network has been conducted. However, in the case where epoxy is added with PPE, it is difficult to realize a prepreg because the PPE is a thermoplastic resin, and an appropriate solvent is difficult to select. Further, methods for the formation of the interpenetrating network structure and the addition of a high-frequency ceramic filler suffer because the TCC cannot be sufficiently decreased.

To overcome the problems, attempts have been made to apply a functional polymer, including LCP (Liquid Crystal Polymer) or BCB (divinyl-siloxane-bis-benzocyclobutene), having high electrical properties, in particular, high dielectric properties, to PCBs.

BCB has a low dissipation factor and stable TCC properties, as illustrated in FIG. 2, but is disadvantageous because it is expensive and easily cracks in a curing reaction. Further, this polymer is not easily formed into a film, and is undesirably difficult to commercialize. Although the LCP has superior dielectric properties, including dielectric constant and dissipation factor, it is problematic in use in high-frequency circuits because the TCC thereof is as high as about 900 ppm/° C. at high temperatures (125° C.), as illustrated in FIG. 3.

SUMMARY OF THE INVENTION

Leading to the present invention, intensive and extensive research into avoiding the problems encountered in the related art resulted in the finding that a high-frequency ceramic filler is dispersed in a liquid crystal polyester resin, thereby obtaining an insulating material for a PCB having superior dielectric properties and a small change in dielectric constant depending on the change in temperature.

Accordingly, the present invention provides an insulating material for a PCB, which can be used in high-frequency circuits.

In addition, the present invention provides an insulating material for a PCB, which has a lower dissipation factor and a smaller change in dielectric constant depending on the change in temperature, compared to conventional epoxy resins and engineering polymers.

According to the present invention, an insulating material for a PCB may include a liquid crystal polyester resin and ceramic powder to thus have a TCC ranging from −300 to +300 ppm/° C. in the temperature range of −55~125° C. and a dielectric constant of 5 to 40.

The insulating material may have a dissipation factor of 0.01 or less.

The ceramic powder may have a chemical composition of $(1-x)(CaTiO_3) \cdot x(LaAlO_3)$ (in which x=0.001~0.5).

In the insulating material, the ceramic powder may be contained in an amount of 10 to 50 vol %.

The ceramic powder may have an average particle size of 0.1 to 5 μm.

The liquid crystal polyester resin may be an aromatic liquid crystal polyester resin.

DESCRIPTION OF THE PREFERRED EMBODIMENTS

Hereinafter, a detailed description will be given of the present invention, with reference to the appended drawings.

Figure 4:
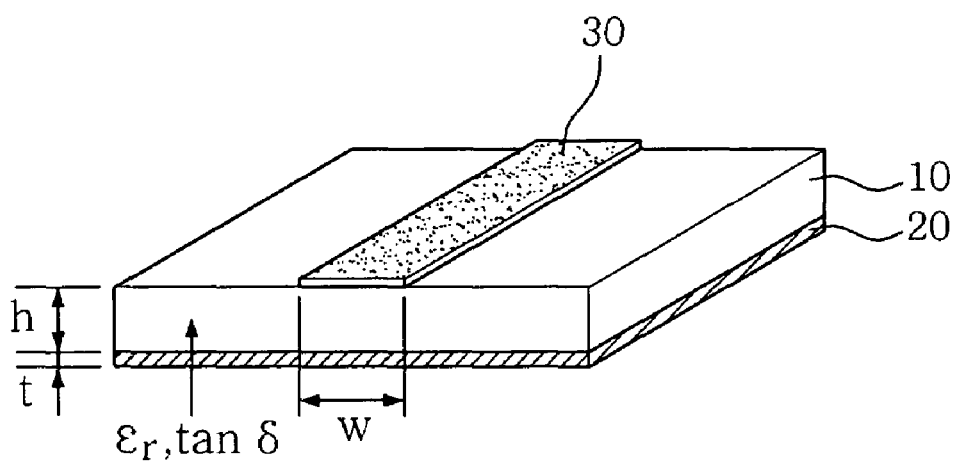
FIG. 4 is a view illustrating the structure of a microstrip.

To satisfactorily transmit a high-frequency signal, in a multilayered substrate, a circuit is designed using a microstrip structure, in which the relationship between a signal line and a GND is definitely set to thus assure easy design. As illustrated in FIG. 4, the microstrip has a substrate structure for forming a circuit in a manner such that an electrode 20 for a GND is formed on the entire bottom surface, the height h and the dielectric constant $\in_r$ of an intermediate insulator (dielectric) 10 are precisely defined, and then a signal line 30 is disposed on the top surface in response to the height/dielectric constant. For impedance matching, not only the width W and the thickness t of the signal line 30 of the microstrip substrate but also the height h and the dielectric constant $\in_r$ of the intermediate insulator 10 thereof should be precisely defined.

The present invention pertains to an insulating material for a PCB, which may be used as the intermediate insulator (dielectric) upon high-frequency circuit design, as mentioned above. The insulating material is characterized in that it has superior dielectric properties, including dielectric constant and dissipation factor, and a small change in dielectric constant depending on the change in temperature.

According to a preferred embodiment of the present invention, the insulating material having desired dielectric properties is obtained through a method of dispersing a high-frequency ceramic filler in the liquid crystal polyester resin.

The insulating material exhibits a TCC of −300~+300 ppm/° C., and preferably −30~+280 ppm/° C. in the temperature range of −55~125° C., and has a dielectric constant of 5~40, and preferably 5~15.

The insulating material has a dissipation factor of about 0.01 or less, and preferably 0.005~0.008, which is much lower than the dissipation factors of conventional epoxy resins and engineering polymers.

Figure 1:
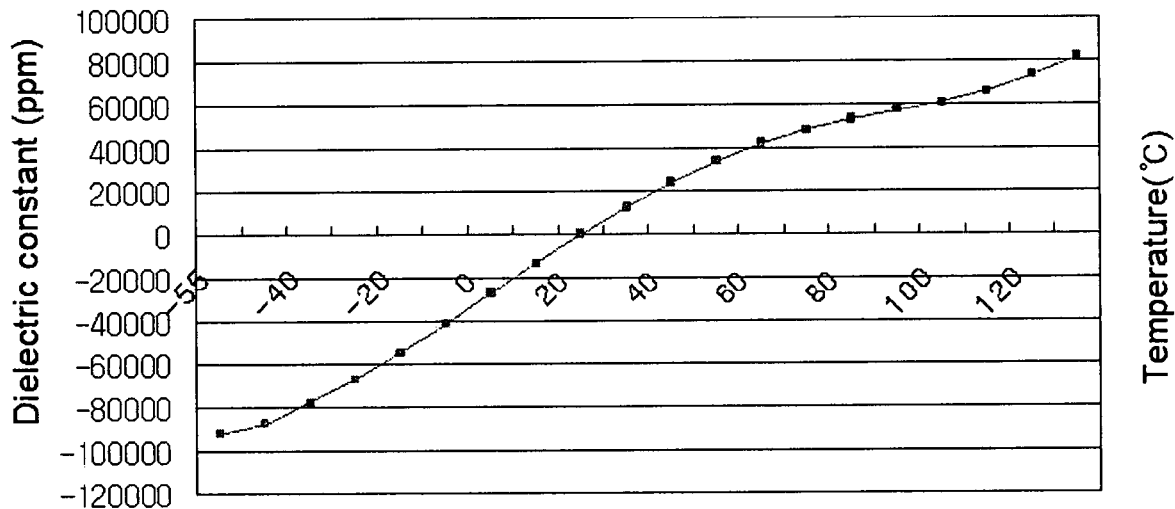
FIG. 1 is a graph illustrating the change in dielectric constant of epoxy over temperature.
Figure 2:
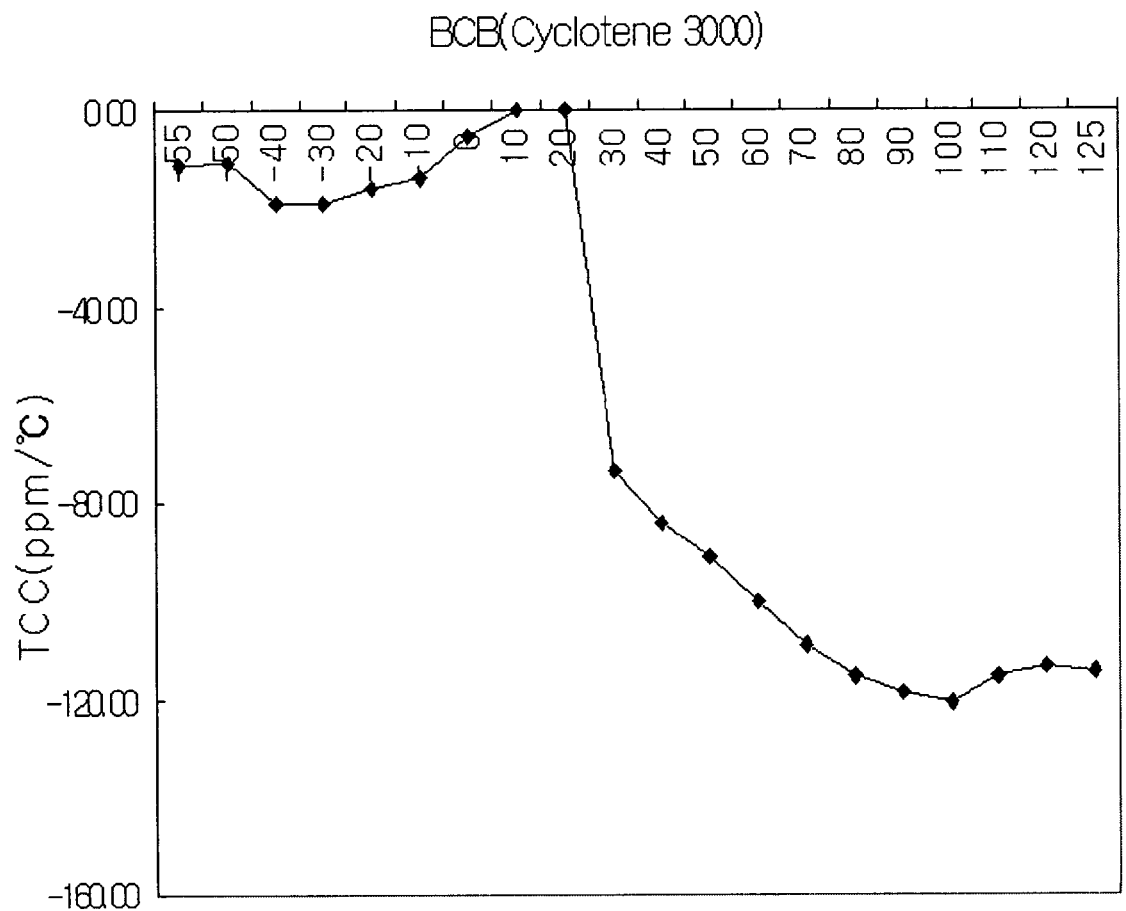
FIG. 2 is a graph illustrating the change in dielectric constant of a functional polymer (e.g., BCB) over temperature.
Figure 3:
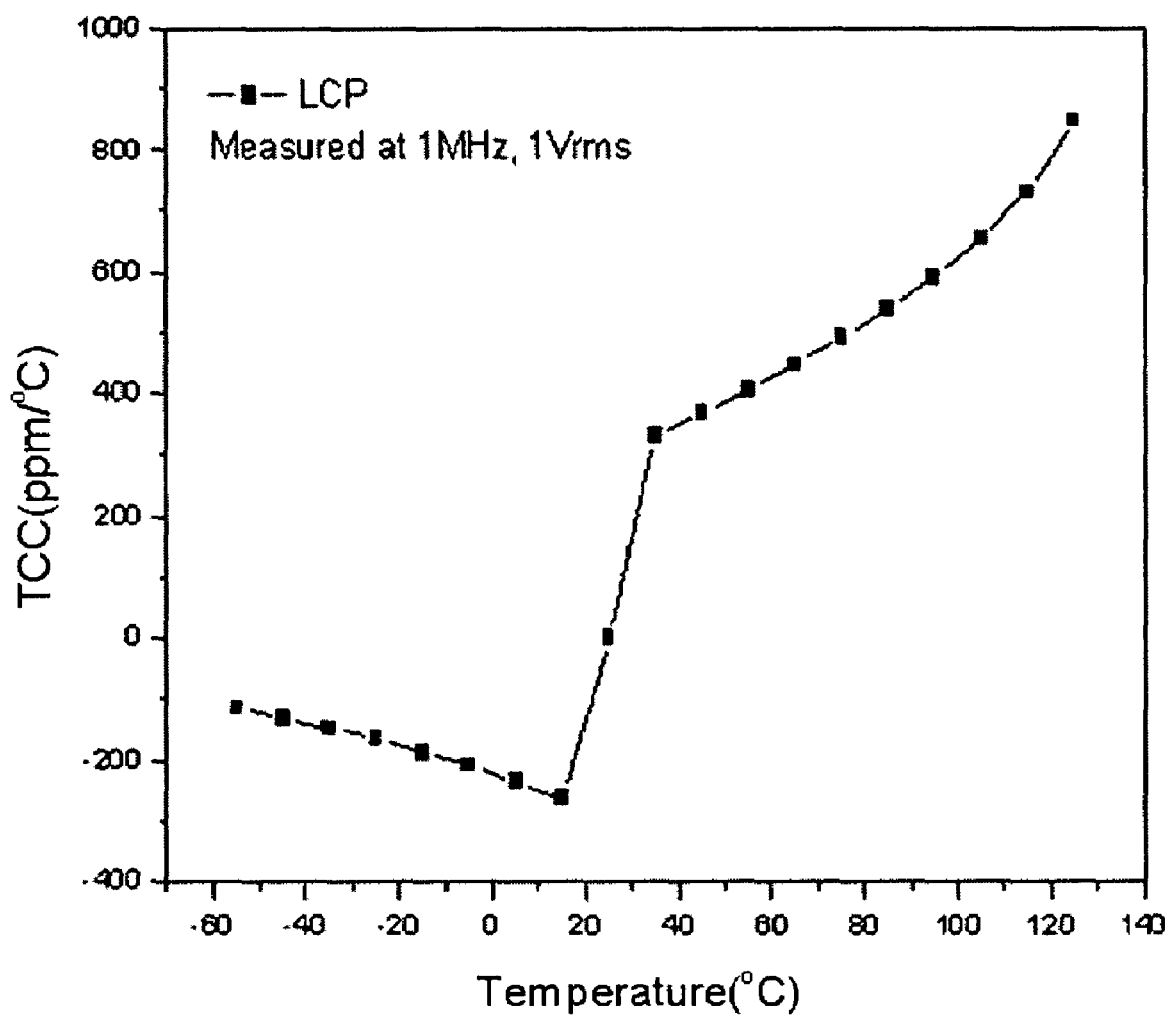
FIG. 3 is a graph illustrating the change in dielectric constant of a functional polymer (e.g., LCP) over temperature.

In the present invention, ceramic powder is used to improve the TCC properties through the dispersion of the ceramic powder having a low dissipation factor and −TCC properties in the liquid crystal polyester having +TCC properties in which the dielectric constant is increased in proportion to an increase in temperature (FIG. 3).

As such, the ceramic powder used in the present invention may be CTLA-based powder, having a chemical composition of $(1-x)(CaTiO_3) \cdot x(LaAlO_3)$, in which x is 0.001~0.5, and preferably 0.15~0.35, to be suitable for exhibiting desired dielectric properties.

In the insulating material, the amount of the ceramic powder is appropriately adjusted depending on the end uses, and is preferably set to 10 to 50 vol %, and more preferably 22 to 37 vol %.

The average particle size of the ceramic powder is not particularly limited, but is preferably set to 0.1 to 5 μm in the interests of improving of dispersibility and workability.

A better understanding of the present invention may be obtained by way of the following examples, which are set forth to illustrate, but are not to be construed to limit, the present invention.

PREPARATIVE EXAMPLE 1

As a CTLA-based filler having a chemical composition of $(1-x)(CaTiO_3) \cdot x(LaAlO_3)$, powders, in which x is 0.01, 0.1 and 0.2, were respectively prepared through the following procedure.

First, as starting materials, $CaCO_3$, having a high purity of 99.9% or more, and $TiO_2$, $La_2O_3$, and $Al_2O_3$ were used, and each material was weighed to be suitable for the composition of $(Ca_{1-x}, La_x)(Ti_{1-x}, Al_x)O_3$ (x=0.01, 0.1, 0.2), placed in a slurry tank, and then wet-mixed using a high-speed dissolver. The weight ratio of material powder and water was 2:1, and 0.5 wt % of a dispersant was added to improve mixing effects and dispersibility.

In order to decrease the hydration of $La_2O_3$ upon the addition of the materials, $CaCO_3$, $TiO_2$ and $Al_2O_3$ were first added, pre-mixed for 4 hours, added with $La_2O_3$, and mixed and pulverized in a circulation process using a bead mill. When the particle size was 1.5 μm or less, the material powder was further subjected to a one-pass process and then dried using a spray dryer.

The spray-dried powder was calcined at 1250° C. for 4 hours, thus synthesizing a $(Ca,La)(Ti,Al)O_3$ solid solution. The synthesized powder was pulverized using a bead mill to make it suitable for use as a filler. In the pulverization condition, the solid solution and water were added in a ratio of 2:1 to thus adjust the concentration of the slurry. The slurry was added with 0.5 wt % of the dispersant, and was then pulverized. When the viscosity of the slurry was increased while pulverizing the particles, 1 wt % of the dispersant was further added.

During the pulverization, the particle size distribution was measured at 1 hour intervals. When the average particle size was decreased to 1 μm or less, the circulation process was stopped, after which the material powder was further subjected to a one-pass process to thus adjust a final particle size to 0.9 μm or less and then spray dried, thereby preparing the filler.

In order to evaluate the electrical properties of the filler thus prepared, 2~3 wt % of an organic material, including a PVA binder, was added to the pulverized powder to prepare granular powder, which was then molded at a pressure of 1 ton/cm² using a cylindrical metal mold having an inner diameter of 15 mm. The molded product was thermally treated at 650° C. for 1 hour to remove the organic material therefrom, and was then sintered at 1450° C. for 3 hours. The dielectric constant and the Q value of the sintered product were measured using a network analyzer (HP8510A) through a Hakki-Colemann method. The results are shown in Table 1 below.

TABLE 1

| $(1-x)(CaTiO_3) \cdot x(LaAlO_3)$ | Dielectric Constant ($\epsilon_T$) | $Q \times f_0$[1)] |
|---|---|---|
| x = 0.01 | 170 | 10,000 |
| x = 0.1 | 90 | 15,000 |
| x = 0.2 | 60 | 20,000 |

[1)]Q is an abbreviated form of Quality factor and is equal to the inverse of dissipation factor, and $f_0$ is frequency.

Figure 5:
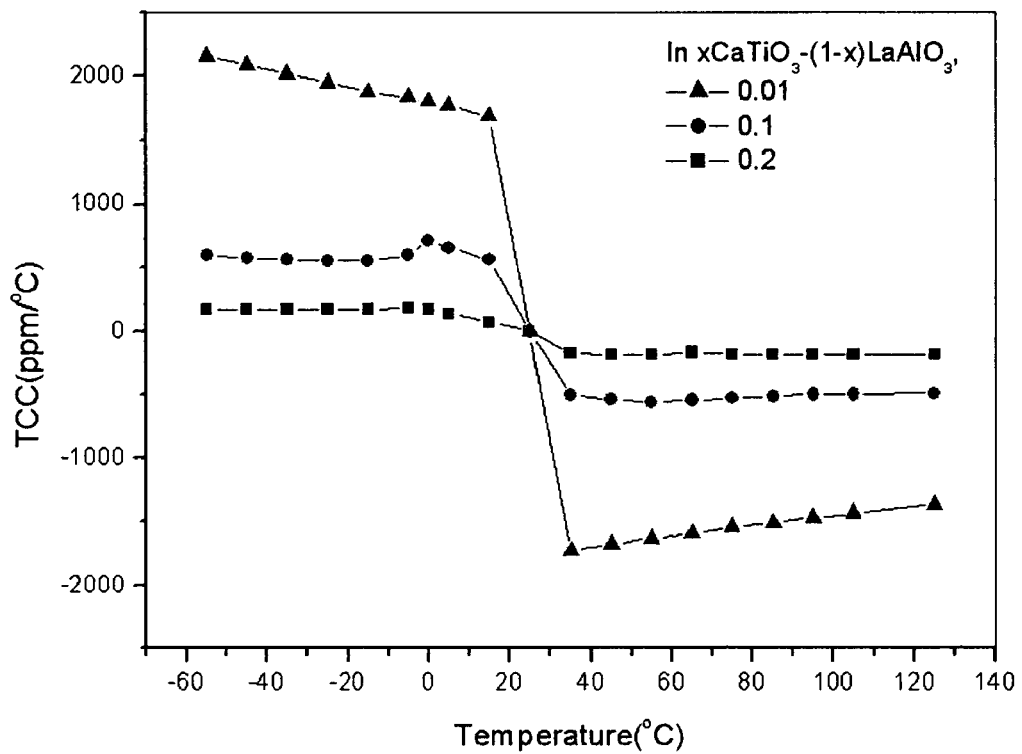
FIG. 5 is a graph illustrating the TCC properties depending on the amount of $LaAlO_3$, in the CTLA prepared in Preparative Example 1 of the present invention.

The TCC of each sintered product was measured. The results are shown in FIG. 5.

EXAMPLE 1

In order to manufacture an insulating film for high frequency, aromatic liquid crystal polyester and tetrafluorophenol were weighed at a weight ratio of 5:95, heated to 120° C., completely dissolved using a stirrer, added respectively with 20, 30, and 40 vol % of CTLA powders (x=0.01, 0.1, 0.2) obtained in Preparative Example 1, added with 1 wt % or less of a dispersant, and then subjected to a dispersion process using a ball mill or a Visco mill, thus preparing a slurry. The slurry was subjected to a defoaming process, applied on copper foil using a tape caster, and dried, thus forming a film 30 μm thick, thereby manufacturing an RCC (Resin Coated Copper) film.

To measure the dielectric properties of the RCC film, the RCC and the copper foil were laminated at a maximum of 300° C. using a high-temperature V press, thus forming electrodes on both surfaces of the insulating film.

Figure 6:
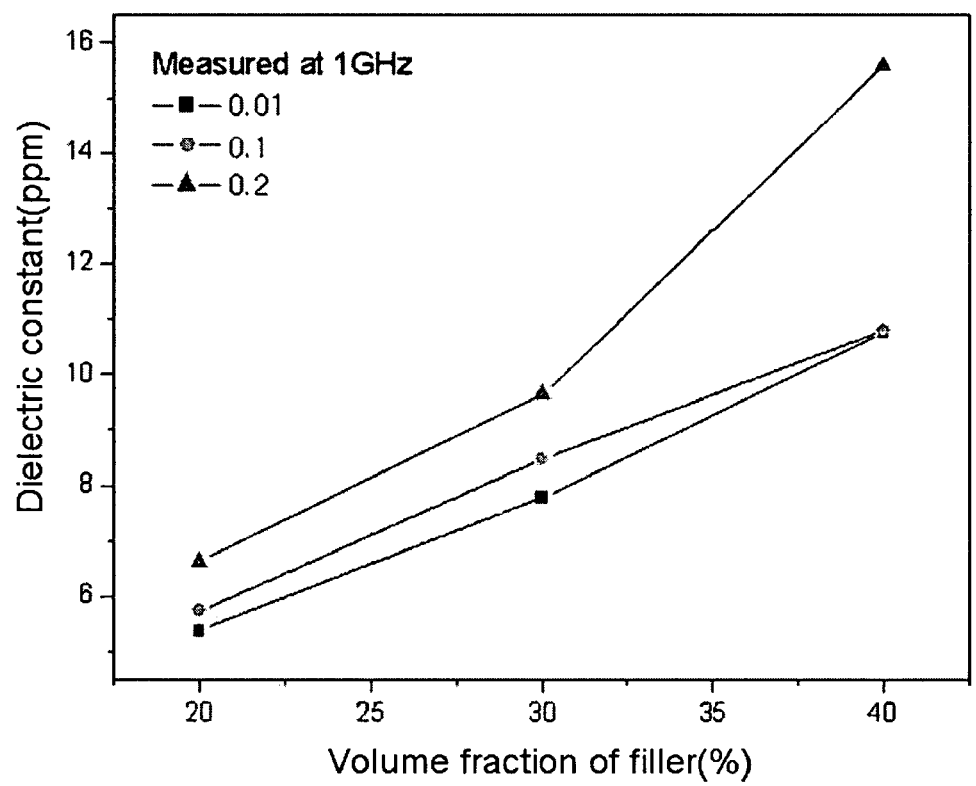
FIG. 6 is a graph illustrating the change in dielectric constant of the insulating film depending on the chemical composition and amount of the filler, in Example 1 of the present invention.

The dielectric constant of the insulating film depending on the amount of the filler is depicted in FIG. 6. The loss value of the RCC containing 30 vol % of the filler at 1 GHz is shown in Table 2 below. The value thus measured is significantly varied not by the chemical composition of powder but by the degree of dispersion thereof, but is as low as 0.01 or less.

TABLE 2

| | CTLA Solid Solution Ratio (x) | | |
|---|---|---|---|
| | 0.01 | 0.1 | 0.2 |
| Dissipation Factor | 0.005 | 0.008 | 0.006 |

Furthermore, the aromatic polyester resin (LCP) used in Example 1, the CTLA filler powder, in which x is 0.2, and the RCC manufactured as above were measured for TCC under conditions of the oscillation voltage of 1 Vrms and the frequency of 1 MHz. The results are shown in FIG. 7.

Figure 7:
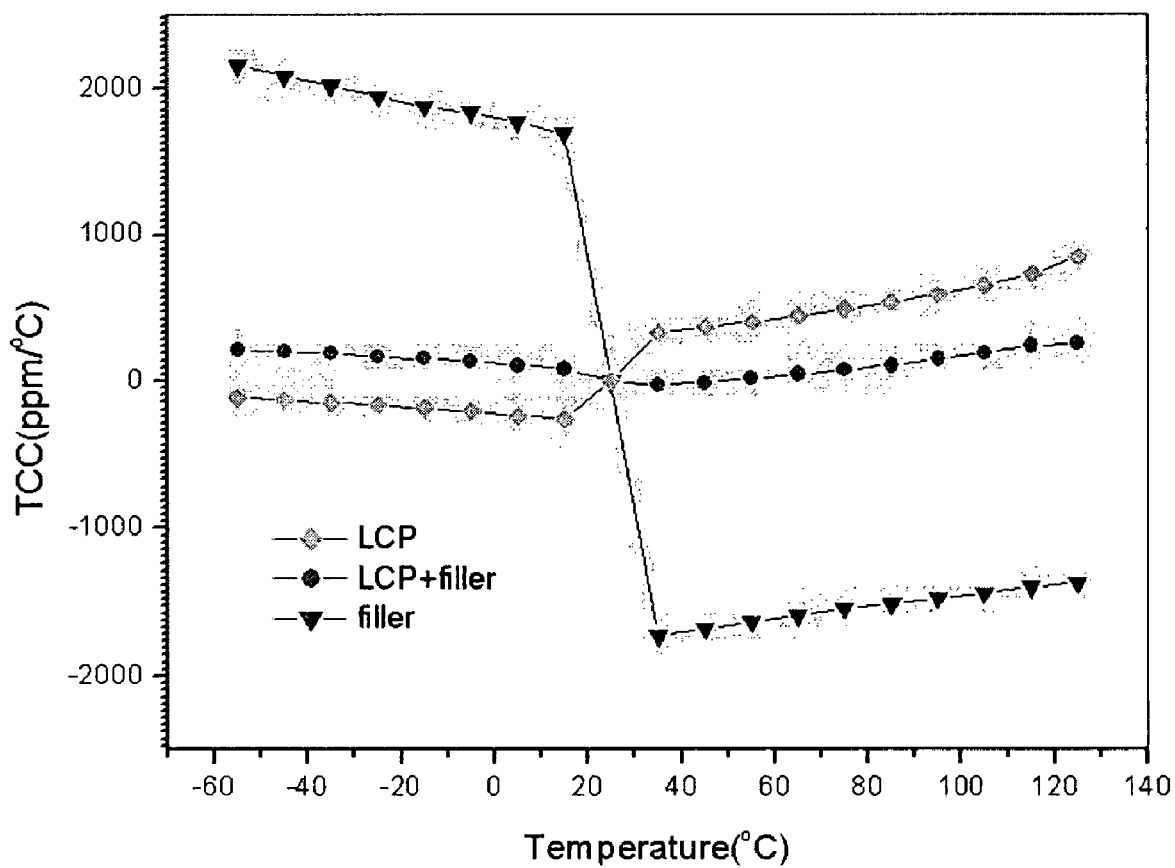
FIG. 7 is a graph illustrating the TCC properties of CTLA in which x=0.2, LCP, and a mixture thereof, in Example 1 of the present invention.

As is apparent from FIG. 7, it can be seen that the TCC of the LCP ranges from −260~+800 ppm/° C. in the temperature range of −55~125° C. but is decreased to −26~+260 ppm/° C. under the same measurement conditions when the CTLA filler is added. In this way, the use of the filler having the considerably great TCC having a sign opposite to that of the resin can be seen to make it possible to decrease the TCC range to a conventional capacitor range.

Although the preferred embodiments of the present invention, with regard to the insulating material for a PCB, have been disclosed for illustrative purposes, those skilled in the art will appreciate that various modifications, additions and substitutions are possible within the technical spirit of the invention.

As described hereinbefore, the present invention provides an insulating material for a PCB. According to the present invention, the insulating material has a smaller change in dielectric constant depending on the change in temperature than conventional insulating materials for PCBs, and may be used as an insulating layer in a circuit when impedance matching is regarded as important. In this case, impedance mismatch, attributable to the change in dielectric constant depending on the change in temperature, may be minimized, and signal loss resulting therefrom may also be reduced, compared to the case where a PCB is manufactured using conventional materials. Further, when a high-frequency part, such as a filter, is realized in a substrate, it is possible to decrease the variation in the band width depending on the temperature, to thus replace an SMT passive device.

As well, in the case where the insulating material of the invention is used as a material for embedding a capacitor having C properties, which is presently mounted on a PCT to realize impedance matching, parasitic inductance may be advantageously reduced compared to when a conventional capacitor is provided.

Simple modifications, additions and substitutions fall within the scope of the present invention as defined in the accompanying claims.

What is claimed is:

1. An insulating material for a printed circuit board, comprising a liquid crystal polyester resin and ceramic powder to thus have a temperature coefficient of capacitance ranging from −300 to +300 ppm/° C. in a temperature range of −55~125° C. and a dielectric constant of 5 to 40.

2. The insulating material as set forth in claim 1, wherein the insulating material has a dissipation factor of 0.01 or less.

3. The insulating material as set forth in claim 1, wherein the ceramic powder has a chemical composition of (1-x) $(CaTiO_3) \cdot x(LaAlO_3)$ (in which x=0.001~0.5).

4. The insulating material as set forth in claim 1, wherein the ceramic powder is contained in the insulating material in an amount of 10 to 50 vol %.

5. The insulating material as set forth in claim 1, wherein the ceramic powder has an average particle size of 0.1 to 5 μm.

6. The insulating material as set forth in claim 1, wherein the liquid crystal polyester resin is an aromatic liquid crystal polyester resin.

* * * * *